United States Patent
Seo et al.

(10) Patent No.: US 7,098,626 B2
(45) Date of Patent: Aug. 29, 2006

(54) POWER SUPPLY APPARATUS

(75) Inventors: Kazuhiro Seo, Hirakata (JP); Kimihiko Furukawa, Kakogawa (JP); Isao Arai, Sano (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/081,814

(22) Filed: Mar. 17, 2005

(65) Prior Publication Data
US 2005/0206347 A1    Sep. 22, 2005

(30) Foreign Application Priority Data
Mar. 18, 2004  (JP)  ............... 2004-077318
Feb. 24, 2005  (JP)  ............... 2005-049235

(51) Int. Cl.
*H02J 7/16* (2006.01)
(52) U.S. Cl. .......................................... 320/150
(58) Field of Classification Search ............... 320/150, 320/116, 118, 119, 157, 160, 162, 163, 164
See application file for complete search history.

(56) References Cited
U.S. PATENT DOCUMENTS
5,767,659 A * 6/1998 Farley ..................... 320/106
6,278,260 B1 * 8/2001 Yang ...................... 320/150
6,563,290 B1 * 5/2003 Sakakibara et al. ......... 320/106

FOREIGN PATENT DOCUMENTS
JP   10-270094   10/1998

* cited by examiner

Primary Examiner—Pia Tibbits
(74) Attorney, Agent, or Firm—McDermott Will & Emery LLP

(57) ABSTRACT

A power supply apparatus has a battery and a temperature detection circuit. The battery has n battery cells, and the temperature detection circuit has m temperature detection units. Each temperature detection units has a temperature sensor that is thermally coupled to one or more of the battery cells and whose electrical resistance decreases as the temperature of the battery cell or battery cells to which it is thermally coupled increases, a serial resistor that is connected in series with the temperature sensor, and a first diode whose cathode is connected to the node between the temperature sensor and the serial resistor. The serial circuit formed by the temperature sensor and the serial resistor receives a predetermined voltage such that, as the electrical resistance of the temperature sensor decreases, the voltage at the node decreases. The first diodes have anodes thereof connected together.

18 Claims, 6 Drawing Sheets

POWER SUPPLY APPARATUS

This application is based on Japanese Patent Applications Nos. 2004-077318 and 2005-49235 filed on Mar. 18, 2004 and Feb. 24, 2005, respectively, the contents of which are hereby incorporated by reference.

BACKGROUND OF THE INVENTION

1. Field of the Invention

The present invention relates to a power supply apparatus for use, for example, in a vehicle to drive a motor for making the vehicle run, or in an electric appliance to drive a load. More particularly, the present invention relates to a power supply apparatus incorporating a temperature detection circuit for detecting the temperature of a battery.

2. Description of Related Art

A vehicle-driving battery for supplying electric power to a motor for driving a vehicle yields a high output voltage thanks to a large number of battery cells, secondary cells, connected in series. This permits a motor to yield an output high enough to make an automobile run. In a power supply apparatus incorporating such a vehicle-driving battery, when the battery is made to discharge a large current to make a motor sharply accelerate an automobile, or when the battery is charged nearly to the fully-charged state with a large current while an automobile is running down with regenerative braking applied, or when the outside air temperature and thus the ambient temperature is abnormally high, or under other conditions, the temperatures of the battery cells become considerably high.

Moreover, a power supply apparatus for a vehicle has a very large number of battery cells, as many as 100 or more of them, connected in series to yield an output voltage as high as 200 V to 400 V. When a large number of battery cells connected in series are charged and discharged, an equal current flows through all the battery cells. However, not all the battery cells deteriorate evenly; that is, only one or more particular battery cells may deteriorate. Variations inevitable in the manufacturing process, differences in external/ambient factors such as the use temperature, etc. cause the individual battery cells to deteriorate unevenly. If any battery cell deteriorates and the full capacity to which it can be charged becomes substantially smaller, charging and discharging that battery cell in the same way as the other battery cells cause it to be overcharged or overdischarged. This makes the cell temperature higher, further promoting the deterioration.

Typically used as battery cells for vehicle-driving batteries are nickel hydride cells and lithium ion secondary cells. Both types of secondary cell exhibit poorer characteristics at higher temperatures, and, at still higher temperatures, exhibit thermal runaway and quickly deteriorate. To prevent this, in a power supply apparatus for a vehicle, the temperatures of individual battery cells are detected. If the temperature of any battery cell becomes, for example, higher than 55° C., the contactor connected to the output side of the vehicle-driving battery is turned off to cut the current and thereby prevent the detrimental effects of raised temperature.

To achieve this, in a conventional power supply apparatus, PTC (positive temperature coefficient) sensors serving as temperature sensors are fixed to and kept in contact with the surface of individual battery cells. This type of power supply apparatus is disclosed, for example, in Japanese Patent Application Laid-Open No. H10-270094 (hereinafter referred to as Patent Publication 1). In the power supply apparatus disclosed in Patent Publication 1, a large number of PTC sensors fixed to individual battery cells are connected in series, and the total resistance of the serially connected PTC sensors is measured. When the temperature of a PTC sensor becomes higher than a set temperature, its electrical resistance abruptly becomes higher. Thus, when the temperature of any of the battery cells becomes higher than the set temperature, the electrical resistance of the serial circuit composed of the PTC sensors becomes higher. Hence, by measuring the electrical resistance of the serial circuit, it is possible to detect that there is a battery cell whose temperature is higher than the set temperature.

However, in a case where a large number of PTC sensors are used, it is impossible to accurately detect the temperatures of the individual battery cells. This is because it is difficult to give all the PTC sensors equal characteristics. For example, with a circuit for detecting the temperatures of individual battery cells by the use of a large number of PTC sensors whose set temperature, i.e., the temperature over which their electrical resistance abruptly increases, includes an error of up to 10%, it is impossible to accurately detect, for all the battery cells, whether or not the temperatures of the individual battery cells are higher than the set temperature. Moreover, in a case where, as disclosed in Patent Publication 1 mentioned above, a large number of PTC sensors are connected in series and their total electrical resistance is detected, the larger the number of PTC sensors serially connected, the more difficult it is to accurately detect the temperatures of the battery cells. This is because, the larger the number of PTC sensors serially connected, the smaller the proportion of the rise in their total electrical resistance that occurs when the electrical resistance of any PTC sensor increases.

SUMMARY OF THE INVENTION

In view of the conventionally encountered inconveniences discussed above, it is an object of the present invention to provide a power supply apparatus that can detect the temperatures of individual battery cells with high accuracy and with a simple circuit design. It is another object of the present invention to provide a power supply apparatus that can control the lowering of the detection accuracy with which the temperatures of individual battery cells are detected even when an increased number of temperature sensors are used to detect the temperatures of the battery cells.

To achieve the above objects, according to a first aspect of the present invention, a power supply apparatus includes a battery for driving a load and a temperature detection circuit for detecting the temperature of the battery. Here, the battery includes n (where n is an integer equal to or greater than 2) battery cells connected in series or in parallel with one another, and the temperature detection circuit includes m (where m is an integer equal to or greater than 2 and fulfilling $n \geq m$) temperature detection units. The temperature detection units each include a temperature sensor that is thermally coupled to one or more of the battery cells and whose electrical resistance decreases as the temperature of the battery cell or battery cells to which it is thermally coupled increases, a serial resistor that is connected in series with the temperature sensor to form a serial circuit and that permits the voltage at the node between the serial resistor and the temperature sensor to vary as the electrical resistance of the temperature sensor varies, and a first diode that is connected to the node so that the forward direction thereof coincides with the direction in which a current flows toward the node. The serial circuit formed by the temperature sensor and the serial resistor receives a predetermined voltage such that, as the electrical resistance of the temperature sensor decreases, the voltage at the node decreases, and the first diodes have anodes thereof connected together.

For example, assume a case where: n equals m; the first, second, . . . , and nth battery cells are thermally coupled to the temperature sensors of the first, second, . . . , and mth temperature detection units; the temperatures of the first to (n−1)th battery cells are all equal; the temperature of the nth battery cell is higher than the temperatures of the other battery cells; and the temperatures of the individual temperature sensors are equal to the temperatures of the battery cells to which they are thermally coupled (hereinafter this assumption will be referred to as "assumption 1").

The electrical resistance of the temperature sensor of each temperature detection unit decreases as the temperature of the battery cell to which it is thermally coupled increases. Thus, the electrical resistance of the temperature sensor of the mth temperature detection unit is smaller than the electrical resistances of the temperature sensors of the other temperature detection units. In each temperature detection unit, the serial circuit composed of the temperature sensor and the serial resistor receives a predetermined voltage such that, as the electrical resistance of the temperature sensor decreases, the voltage at the node decreases. Thus, the voltage at the node in the mth temperature detection unit is lower than those in the other temperature detection units.

On the other hand, each first diode is connected in such a direction as to pass a current to the node, and the anodes of the first diodes of all the temperature detection units are connected together. Thus, at the anodes of the first diodes appears a voltage that reflects the voltage at the node in the mth temperature detection unit, i.e., a voltage corresponding to the temperature of the nth battery cell whose temperature is higher than the temperatures of the other battery cells. Based on this voltage, it is possible to accurately detect the temperature of the nth battery cell whose temperature is higher than the temperatures of the other battery cells.

Thus, with the circuit design described above, if the temperature of any one battery cell becomes comparatively high, it is possible to accurately detect the temperature of the battery cell whose temperature is comparatively high. Moreover, since the voltage at each node is not affected by the number of temperature sensors, even when the number of temperature sensors is increased, that does not lower (or hardly lowers) the detection accuracy with which the temperatures of the individual battery cells are detected.

Moreover, in the above-described power supply apparatus according to the first aspect of the present invention, for example, the temperature detection circuit includes a first comparator that compares the voltage at the anodes of the first diodes that are connected together with a first reference voltage and that then outputs the result of comparison. The temperature detection circuit detects, based on the output of the first comparator, whether or not the highest temperature among the temperatures of the individual battery cells has reached a predetermined upper limit temperature.

Under assumption 1 mentioned above, at the anodes of the first diodes appears a voltage corresponding to the temperature of the nth battery cell whose temperature is higher than the temperatures of the other battery cells. This voltage is lower the higher the temperature of the nth battery cell becomes. For example when this voltage becomes lower than the first reference voltage, the first comparator outputs a binary signal (for example, a high-potential signal) to indicate that. Thus, for example by setting the first reference voltage at a voltage that indicates the upper limit temperature of the cell temperature, it is possible to accurately detect, based on the output of the first comparator, whether or not the temperature of any battery cell is higher than the upper limit temperature.

Moreover, in the above-described power supply apparatus according to the first aspect of the present invention, for example, the temperature detection circuit includes a second comparator that compares the voltage at the anodes of the first diodes that are connected together with a second reference voltage lower than the first reference voltage and that then outputs the result of comparison. The temperature detection circuit detects, based on the output of the second comparator, whether or not any temperature sensor is short-circuited.

For example, if the temperature sensor of any temperature detection unit is short-circuited, the voltage at the node between the serial resistor and the temperature sensor in that temperature detection unit may become comparatively low (for example, approximately 0 V). When short-circuiting like this occurs, at the anodes of the first diodes appears a comparatively low voltage. Thus, by setting the second reference voltage at a voltage that permits recognition of such short-circuiting, it is possible to detect occurrence of short-circuiting based on the output of the second comparator.

Moreover, in the above-described power supply apparatus according to the first aspect of the present invention, for example, the second reference voltage is so set as to be higher than the voltage at the anodes of the first diodes as observed when any temperature sensor is short-circuited.

For example, in a case where the voltage at the anodes of the first diodes as observed when the temperature sensor of any temperature detection unit is short-circuited is 0.2 V, the second reference voltage is so set as to fulfill the inequality "0.2 V<second reference voltage". This makes it possible to accurately detect occurrence of short-circuiting as mentioned above.

Moreover, in the above-described power supply apparatus according to the first aspect of the present invention, for example, the temperature detection units each further include a second diode that is connected to the node so that the forward direction thereof coincides with the direction in which a current flows away from the node, and the cathodes of the second diodes are connected together. The temperature detection circuit includes a third comparator that compares the voltage at the cathodes of the second diodes that are connected together with a third reference voltage higher than the first reference voltage and that then outputs the result of comparison. The temperature detection circuit detects, based on the output of the third comparator, whether or not any temperature sensor is open.

If the temperature sensor of any temperature detection unit becomes open, the voltage at the node between the serial resistor and the temperature sensor in that temperature detection unit may become comparatively high. In this state, at the cathodes of the second diodes appears a comparatively high voltage. Thus, by setting the third reference voltage at a voltage that permits recognition of such an open state, it is possible to detect occurrence of an open state based on the output of the third comparator.

Moreover, in the above-described power supply apparatus according to the first aspect of the present invention, for example, the third reference voltage is so set as to be lower than the voltage at the cathodes of the second diodes as observed when any temperature sensor is open.

Moreover, in the above-described power supply apparatus according to the first aspect of the present invention, for example, the third reference voltage is so set as to be higher than the voltage at the cathodes of the second diodes as observed when the temperatures of all the battery cells are equal to a predetermined lower limit temperature.

For example, in a case where the voltage at the cathodes of the second diodes as observed when the temperature sensor of any temperature detection unit becomes open is 4.9 V and the voltage at the cathodes of the second diodes as observed when the temperatures of all the battery cells are equal to the predetermined lower limit temperature is 4 V, the third reference voltage is so set as to fulfill the inequality "4V<third reference voltage<4.9 V". This makes it possible to accurately detect occurrence of an open state as mentioned above, and to prevent erroneous detection of occurrence of an open state as mentioned above.

Moreover, in the above-described power supply apparatus according to the first aspect of the present invention, for example, the temperature sensors are thermistors.

Moreover, in the above-described power supply apparatus according to the first aspect of the present invention, for example, the temperature detection units each further include a second diode that is connected to the node so that the forward direction thereof coincides with the direction in which a current flows away from the node, and the cathodes of the second diodes are connected together. The temperature detection circuit includes a second comparator that compares the voltage at the anodes of the first diodes that are connected together with a second reference voltage lower than the first reference voltage and that then outputs the result of comparison, and a third comparator that compares the voltage at the cathodes of the second diodes that are connected together with a third reference voltage higher than the first reference voltage and that then outputs the result of comparison. The temperature detection circuit detects, based on the output of the second comparator, whether or not any temperature sensor is short-circuited, and detects, based on the output of the third comparator, whether or not any temperature sensor is open. The temperature detection circuit further includes a fault evaluation circuit that detects, based on the outputs of the second and third comparators, whether or not any temperature sensor is short-circuited or open.

To achieve the above objects, according to a second aspect of the present invention, a power supply apparatus includes a battery for driving a load and a temperature detection circuit for detecting the temperature of the battery. Here, the battery includes n (where n is an integer equal to or greater than 2) battery cells connected in series or in parallel with one another, and the temperature detection circuit includes m (where m is an integer equal to or greater than 2 and fulfilling $n \geq m$) temperature detection units. The temperature detection units each including a temperature sensor that is thermally coupled to one or more of the battery cells and whose electrical resistance decreases as a temperature of the battery cell or battery cells to which the temperature sensor is thermally coupled increases, a serial resistor that is connected in series with the temperature sensor to form a serial circuit and that permits the voltage at the node between the serial resistor and the temperature sensor to vary as the electrical resistance of the temperature sensor varies, and a first diode that is connected to the node so that the forward direction thereof coincides with the direction in which a current flows away from the node. The serial circuit formed by the temperature sensor and the serial resistor receives a predetermined voltage such that, as the electrical resistance of the temperature sensor decreases, the voltage at the node increases, and the first diodes have cathodes thereof connected together.

Also with this power supply apparatus according to the second aspect of the present invention, if the temperature of any one battery cell becomes comparatively high, it is possible to accurately detect the temperature of the battery cell whose temperature is comparatively high. Moreover, since the voltage at each node is not affected by the number of temperature sensors, even when the number of temperature sensors is increased, that does not lower (or hardly lowers) the detection accuracy with which the temperatures of the individual battery cells are detected.

Moreover, in the above-described power supply apparatus according to the second aspect of the present invention, for example, the temperature detection circuit includes a first comparator that compares the voltage at the cathodes of the first diodes that are connected together with a first reference voltage and that then outputs the result of comparison. The temperature detection circuit detects, based on the output of the first comparator, whether or not the highest temperature among the temperatures of the individual battery cells has reached a predetermined upper limit temperature.

For example by setting the first reference voltage at a voltage that indicates the upper limit temperature of the cell temperature, it is possible to accurately detect whether or not the temperature of any battery cell is higher than the upper limit temperature.

Moreover, in the above-described power supply apparatus according to the second aspect of the present invention, for example, the temperature detection circuit includes a second comparator that compares the voltage at the cathodes of the first diodes that are connected together with a second reference voltage higher than the first reference voltage and that then outputs the result of comparison. The temperature detection circuit detects, based on the output of the second comparator, whether or not any temperature sensor is short-circuited.

For example, if the temperature sensor of any temperature detection unit is short-circuited, the voltage at the node between the serial resistor and the temperature sensor in that temperature detection unit may become comparatively high. When short-circuiting like this occurs, at the cathodes of the first diodes appears a comparatively high voltage. Thus, by setting the second reference voltage at a voltage that permits recognition of such short-circuiting, it is possible to detect occurrence of short-circuiting based on the output of the second comparator.

Moreover, in the above-described power supply apparatus according to the second aspect of the present invention, for example, the second reference voltage is so set as to be lower than the voltage at the cathodes of the first diodes as observed when any temperature sensor is short-circuited.

For example, in a case where the voltage at the cathodes of the first diodes as observed when the temperature sensor of any temperature detection unit is short-circuited is 4.9 V, the second reference voltage is so set as to fulfill the inequality "second reference voltage<4.9 V". This makes it possible to accurately detect occurrence of short-circuiting as mentioned above.

Moreover, in the above-described power supply apparatus according to the second aspect of the present invention, for example, the temperature detection units each further include a second diode that is connected to the node so that the forward direction thereof coincides with the direction in which a current flows toward the node, and the anodes of the second diodes are connected together. The temperature detection circuit includes a third comparator that compares the voltage at the anodes of the second diodes that are connected together with a third reference voltage lower than the first reference voltage and that then outputs the result of comparison. The temperature detection circuit detects, based on the output of the third comparator, whether or not any temperature sensor is open.

If the temperature sensor of any temperature detection unit becomes open, the voltage at the node between the serial resistor and the temperature sensor in that temperature detection unit may become comparatively low (for example, approximately 0 V). In this state, at the anodes of the second diodes appears a comparatively low voltage. Thus, by setting the third reference voltage at a voltage that permits recognition of such an open state, it is possible to detect occurrence of an open state based on the output of the third comparator.

Moreover, in the above-described power supply apparatus according to the second aspect of the present invention, for example, the third reference voltage is so set as to be higher than the voltage at the anodes of the second diodes as observed when any temperature sensor is open.

Moreover, in the above-described power supply apparatus according to the second aspect of the present invention, for example, the third reference voltage is so set as to be lower than the voltage at the anodes of the second diodes as observed when the temperatures of all the battery cells are equal to a predetermined lower limit temperature.

For example, in a case where the voltage at the anodes of the second diodes as observed when the temperature sensor of any temperature detection unit becomes open is 0.1 V and the voltage at the anodes of the second diodes as observed when the temperatures of all the battery cells are equal to the predetermined lower limit temperature is 1.0 V, the third reference voltage is so set as to fulfill the inequality "0.1 V<third reference voltage<1.0 V". This makes it possible to accurately detect occurrence of an open state as mentioned above, and to prevent erroneous detection of occurrence of an open state as mentioned above.

Moreover, in the above-described power supply apparatus according to the second aspect of the present invention, for example, the temperature sensors are thermistors.

Moreover, in the above-described power supply apparatus according to the second aspect of the present invention, for example, the temperature detection units each further include a second diode that is connected to the node so that the forward direction thereof coincides with the direction in which a current flows toward the node, and the anodes of the second diodes are connected together. The temperature detection circuit includes a second comparator that compares the voltage at the cathodes of the first diodes that are connected together with a second reference voltage higher than the first reference voltage and that then outputs the result of comparison, and a third comparator that compares the voltage at the anodes of the second diodes that are connected together with a third reference voltage lower than the first reference voltage and that then outputs the result of comparison. The temperature detection circuit detects, based on the output of the second comparator, whether or not any temperature sensor is short-circuited, and detects, based on the output of the third comparator, whether or not any temperature sensor is open. The temperature detection circuit further includes a fault evaluation circuit that detects, based on the outputs of the second and third comparators, whether or not any temperature sensor is short-circuited or open.

DETAILED DESCRIPTION OF PREFERRED EMBODIMENTS

First Embodiment

Hereinafter, the power supply apparatus of a first embodiment of the present invention will be described with reference to the drawings. It should be understood that the first embodiment described below and the second and third embodiments that will be described later are all intended merely to present examples of power supply apparatuses in which the technical idea of the present invention is embodied, and thus none of the power supply apparatuses specifically presented below is meant to limit the present invention in any way.

Power supply apparatuses embodying the invention (the power supply apparatus of the first, second, and third embodiments of the invention) are mounted on vehicles (not illustrated) such as hybrid cars, electric automobiles, and electric forklifts, or vehicles or the like (not illustrated) that run indoors to transport goods, so as to be used as power sources for driving the motors (not illustrated) that make those vehicles run. Power supply apparatuses embodying the invention, however, find application not only in vehicles but also as power sources for driving various loads (not illustrated).

Figure 1:
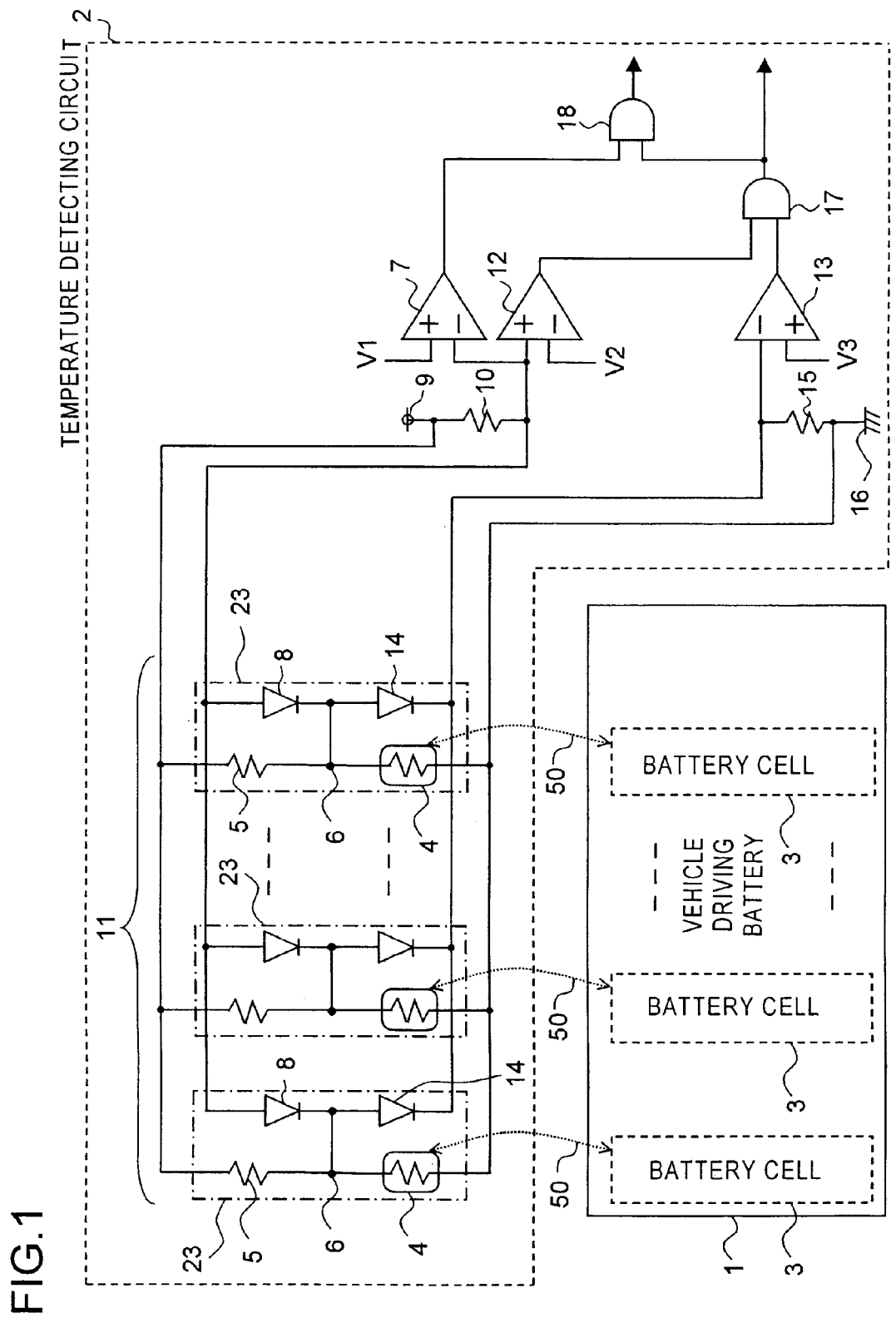
FIG. 1 is a circuit diagram of the power supply apparatus of a first embodiment of the invention.
Figure 6:
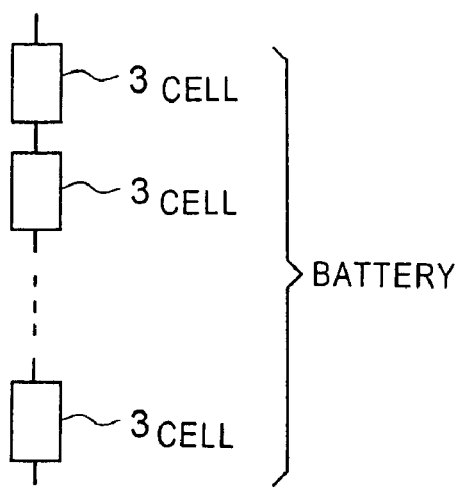
FIG. 6 is a circuit diagram showing an example of the interconnection among the battery cells in the battery shown in FIG. 1.
Figure 7:
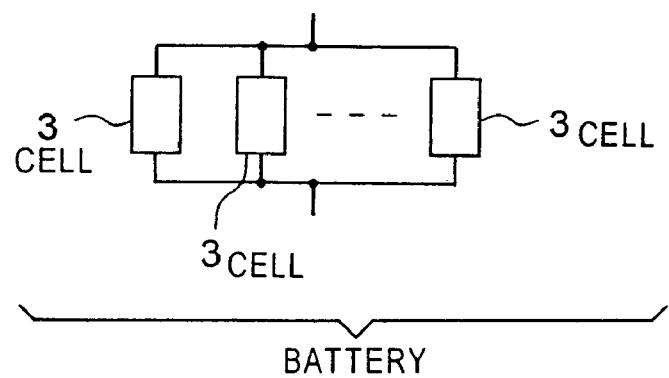
FIG. 7 is a circuit diagram showing another example of the interconnection among the battery cells in the battery shown in FIG. 1.

FIG. 1 is a circuit diagram of the power supply apparatus of a first embodiment of the invention. The power supply apparatus shown in FIG. 1 includes: a vehicle-driving battery 1 that is composed of n (where n is an integer equal to or greater than 2) battery cells 3 connected in series or in parallel with one another (see FIGS. 6 and 7) and that drives a motor that makes a vehicle run; and a temperature detection circuit 2 that detects the temperature of the battery 1. In the power supply apparatus shown in FIG. 1, although not illustrated, a plurality of battery cells are connected in series to form a power module, and a plurality of such power modules are connected in series with one another to permit the power supply apparatus to yield a high output voltage.

The temperature detection circuit 2 includes: the same number of temperature detection units 23 as there are battery cells 3 (i.e., n temperature detection units 23), with the temperature detection units 23 used to detect the temperatures of the battery cells 3 individually; a power supply (power supply circuit) 9; a first comparator 7; a second comparator 12; a third comparator 13; a pull-up resistor 10; and a pull-down resistor 15. The n temperature detection units 23 together form a temperature sensor circuit 11. The power supply 9 adopts a well-known circuit design, and therefore no detailed circuit design thereof is illustrated.

Each temperature detection unit 23 includes: a temperature sensor 4 that is thermally coupled to one of the battery cells 3 constituting the battery 1 and that detects the temperature of the battery cell 3 to which it is thermally coupled; a serial resistor 5 that is connected in series with the temperature sensor 4; a first diode 8; and a second diode 14. The components used and the interconnection among them are the same in all the temperature detection units 23. In FIG. 1, each temperature detection unit 23 is demarcated by dot-and-dash lines. Moreover, in FIG. 1, arrowed dotted lines 50 conceptually indicate how the individual temperature sensors 4 are thermally coupled to the corresponding battery cells 3.

In each temperature detection unit 23, one end of the serial resistor 5 is connected to one end of the temperature sensor 4, and the other end of the serial resistor 5 is connected to the power supply 9 (to the positive-side output terminal of the power supply 9). The serial resistor 5 receives, at this other end, a 5 V supply voltage outputted from the power supply 9. Needless to say, the supply voltage outputted from the power supply 9 may be other than 5 V. In each temperature detection unit 23, the end of the temperature sensor 4 opposite to the node 6 between it and the serial resistor 5 is connected to signal ground 16 so as to be kept fixed at a potential of 0 V. Incidentally, the signal ground 16 is not connected to the chassis ground of the vehicle on which the power supply apparatus is mounted. In each temperature detection unit 23, the cathode of the first diode 8 and the anode of the second diode 14 are both connected to the node 6. That is, the first diode 8 is connected to the node 6 so that the forward direction thereof coincides with the direction in which a current flows toward the node 6; the second diode 14 is connected to the node 6 so that the forward direction thereof coincides with the direction in which a current flows away from the node 6.

The anodes of the first diodes 8 of all the temperature detection units 23 are connected together, and their common node is connected via the pull-up resistor 10 to the power supply 9 (to the positive-side output terminal of the power supply 9), and is also connected commonly to the inverting input terminal (−) of the first comparator 7 and to the non-inverting input terminal (+) of the second comparator 12. The cathodes of the second diodes 14 of all the temperature detection units 23 are connected together, and their common node is connected via the pull-down resistor 15 to the signal ground 16, and is also connected to the inverting input terminal (−) of the third comparator 13. The number of temperature detection units 23 included in the temperature sensor circuit 11 (i.e., the value of n) is, for example, 10 to 50 (needless to say, any other number will do). In this case, 10 to 50 nodes 6 are connected via the first diodes 8 to the input side of the first comparator 7.

The temperature sensors 4 are so arranged as to be thermally coupled to the battery cells 3 on a one-to-one basis. That is, the first, second, third, . . . , and nth temperature sensors 4 are so arranged as to be thermally coupled to the first, second, third, . . . , and nth battery cells 3, respectively. The first, second, third, . . . , and nth temperature sensors 4 are provided in the first, second, third, . . . , and nth temperature detection units 23, respectively.

Preferably, the temperature sensors 4 are thermally coupled to the corresponding battery cells 3 by being brought into contact with the surface of the corresponding battery cells 3. Alternatively, the temperature sensors 4 are thermally coupled to the corresponding battery cells 3 via adhesive (for example, silicone-based adhesive or the like) with high thermal conductivity. For example, the temperature sensors 4 are fixed to the surface of the battery cells 3 by being bonded thereto. Alternatively, the temperature sensors 4 are placed between heat-shrinkable tube and the corresponding battery cells 3, and are fixed to the surface of the battery cells 3 by the heat-shrinkable tube.

Ideally, the temperature sensors 4 are thermally coupled to the battery cells 3 on a one-to-one basis so that the temperature of each battery cell 3 is detected with one temperature sensor 4. However, the temperature of a plurality of battery cells 3 may be detected with one temperature sensor 4. In this case, fewer temperature sensors 4 (and thus fewer temperature detection units 23) are needed than the number of battery cell 3. These temperature sensors are each arranged, for example, at the boundary between two battery cells 3 to detect the temperature of both of the battery cells 3 arranged on either side. Alternatively, a plurality of battery cells 3 may be thermally coupled to one temperature sensor 4 via a heat-conducting plate. This also makes it possible to detect the temperature of a plurality of battery cells 3 with one temperature sensor 4. In this embodiment, the temperature sensors 4 are thermally coupled to the battery cells 3. Alternatively, the temperature sensors 4 may be thermally coupled to any other kind of battery, for example packed batteries or modular batteries.

The temperature sensors 4 are each realized with a device such as a thermistor (for example, an NTC—negative temperature coefficient—thermistor) whose electrical resistance decreases as the temperature of the battery cell 3 to which it is thermally coupled (and thus the temperature of the temperature sensor 4 itself) increases. Thermistors (for example, NTC thermistors) have the advantage of little variations among individual devices. Thus, with a power supply apparatus that adopts thermistors (for example, NTC thermistors) as temperature sensors 4, it is possible to detect the temperatures of a large number of battery cells 3 correctly and with high accuracy. The temperature sensors 4 may be realized with devices of any type other than thermistors so long as their electrical resistance deceases with increasing temperature.

The temperature coefficient of the electrical resistance of each serial resistor 5 is sufficiently low as compared with the temperature coefficient of the electrical resistance of each temperature sensor 4, and the electrical resistance of each serial resistor 5 is assumed to remain substantially fixed over the use temperature range of the serial resistor 5. The pull-up resistor 10 is given an electrical resistance, for example 100 kΩ, sufficiently high as compared with that of each serial resistor 5. This pull-up resistor 10 pulls up the inverting input terminal (−) of the first comparator 7 and the non-inverting input terminal (+) of the second comparator 12. The pull-down resistor 15 is given an electrical resistance, for example 100 kΩ, sufficiently high as compared with that of each serial resistor 5. This pull-down resistor 15 pulls down the inverting input terminal (−) of the third comparator 13.

In the following description of this embodiment, for the sake of simplicity, the temperature of each temperature sensor 4 is assumed to be equal to that of the battery cell 3 to which it is thermally coupled, and the forward voltages of the first and second diodes 8 and 14 are ignored.

In each temperature detection unit 23, the electrical resistance of the temperature sensor 4 decreases as the temperature of the battery cell 3 (hereinafter referred to simply as the "cell temperature" also) to which it is thermally coupled increases, causing the voltage at the node 6 to decrease accordingly. This is because the serial circuit composed of each temperature sensor 4 and the corresponding serial resistor 5 receives, at both ends thereof, a positive voltage of 5 V relative to the temperature sensor 4 side thereof. For example, in a state where the cell temperature is comparatively low, if the electrical resistance of the temperature sensor 4 is equal to that of the serial resistor 5, the voltage at the node 6 is 2.5 V. When the cell temperature rises and the electrical resistance of the temperature sensor 4 decreases, the voltage at the node 6 decreases to, for example, 2.0 V. Thus, by detecting the voltage at the node 6, it is possible to detect the electrical resistance of the temperature sensor 4 and thus the cell temperature.

Each first diode 8 connected the corresponding node 6 to the input side of the first comparator 7. That is, each first diode 8 has one end thereof connected to the corresponding node 6, and has the other end thereof connected to the input side of the first comparator 7.

For example, if the temperatures of the first to (n−1)th battery cells 3 are all equal, and in addition the temperature of the nth battery cell 3 is higher than the temperatures of the other battery cells, the voltage at the node 6 in the nth temperature detection unit 23 is lower than the voltage at the nodes 6 in the first to (n−1)th temperature detection units 23. Thus, at the inverting input terminal (−) of the first comparator 7 appears the voltage at the node 6 in the nth temperature detection unit 23. That is, the voltage at, of all the n nodes 6, the one that yields the lowest voltage (hereinafter referred to as the lowest voltage among the nodes 6) appears at the anode of the first diode 8.

The first comparator 7 receives, at the non-inverting input terminal (+) thereof, a first reference voltage V1 that indicate the upper limit temperature of each battery cell 3, and the first comparator 7 compares the lowest voltage among the nodes 6 with the first reference voltage V1. The upper limit temperature just mentioned indicates the permissible highest temperature of each battery cell 3, and is set at a temperature, for example, in the range from 50° C. to 60° C. The first reference voltage V1 is so set that, when the temperature of, of the n battery cells 3, the one with the highest temperature (hereinafter referred to as the highest temperature among the battery cells 3) is equal to the upper limit temperature, the voltages at the non-inverting input terminal (+) and inverting input terminal (−) of the first comparator 7 are equal.

Since the first comparator 7 receives, at the inverting input terminal (−) thereof, the lowest voltage among the nodes 6 that indicates the highest temperature among the battery cells 3, it is possible to detect, based on the output of the first comparator 7, whether or not the highest temperature among the battery cells 3 has reached the upper limit temperature.

Specifically, when the voltages at all the nodes 6 are higher than the first reference voltage V1, in other words when the temperatures of all the battery cells 3 are lower than the upper limit temperature, the first comparator 7 outputs a "low" (a low-potential signal). This is because the pull-up resistor 10 makes the voltage at the inverting input terminal (−) of the first comparator 7 higher than the first reference voltage V1. On the other hand, when the temperature of at least one battery cell 3 is higher than the upper limit temperature (in other words when the highest temperature among the battery cells 3 is higher than the upper limit temperature), the voltage at the inverting input terminal (−) of the first comparator 7 is lower than the first reference voltage V1, and thus the first comparator 7 outputs a "high" (a high-potential signal). This is because the voltage at the node 6 corresponding to the battery cell 3 whose temperature has exceeded the upper limit temperature becomes lower than the first reference voltage V1, and that voltage is fed via the corresponding first diode 8 to the inverting input terminal (−) of the first comparator 7.

The "high" signal from the first comparator 7 serves as a high temperature signal. The first reference voltage V1 determines the upper limit temperature of the battery cells 3, i.e., the boundary temperature above or below which the first comparator 7 outputs or does not output the high temperature signal. In each temperature detection unit 23, the voltage at the node 6 is determined by the ratio of the electrical resistance of the serial resistor 5 to that of the temperature sensor 4. Whereas the electrical resistance of the serial resistor 5 is approximately fixed, the electrical resistance of the temperature sensor 4 varies with the temperature of the battery cell 3 to which it is thermally coupled. If the upper limit temperature of the battery cells 3 as determined by the first reference voltage V1 and other factors is set too high, the battery cells 3 deteriorate quickly; by contrast, if it is set too low, the probability of the battery 1 failing to supply electric power to the motor (not illustrate) is high. Thus, preferably, the upper limit temperature of the battery cells 3 is set within the above-mentioned range (from 50° C. to 60° C.) so as to prevent quick deterioration of the battery cells 3 while permitting the battery 1 to effectively drive the motor.

For example, in a case where the above-mentioned upper limit temperature is set at 55° C., when the temperature of any battery cell 3 becomes equal to 55° C., if the voltage at the node 6 corresponding to that battery cell 3 is 1.2 V, the first reference voltage V1 is set at 1.2 V. In this case, when the temperature of any battery cell 3 becomes higher than the upper limit temperature, specifically 55° C., the first comparator 7 turns its output signal from "low" to "high", That is, when the temperature of any battery cell 3 exceeds the upper limit temperature, the first comparator 7 outputs a high temperature signal.

In the present invention, the high temperature signal of the first comparator 7 is not limited to a "high". The circuit design of the power supply apparatus may be so modified that the first comparator 7 outputs a "low" as a high temperature signal (the modified circuit design is not illustrated). In this case, the first comparator has the non-inverting input terminal (+) thereof connected to the anodes of the first diodes 8 connected together, and receives, at the inverting input terminal (−) thereof, the first reference voltage V1. With this first comparator, when the temperature of any battery cell 3 rises to the upper limit temperature, the voltage at the non-inverting input terminal (+) becomes lower than the voltage at the inverting input terminal (−), and thus the first comparator turns its output from "high" to "low". That is, a "low" is outputted as a high temperature signal.

The temperature detection circuit 2 further includes a circuit that detects, for each temperature sensor 4, whether or not it is in a short-circuited or open state. The second comparator 12 detects short-circuiting occurring in the temperature sensor circuit 11, and the third comparator 13 detects an open state occurring in the temperature sensor circuit 11.

The second comparator 12 receives, at the inverting input terminal (−) thereof, a second reference voltage V2, and the second comparator 12 compares the lowest voltage among the nodes 6 with the second reference voltage V2.

The second reference voltage V2 is set at a voltage lower than the first reference voltage V1. When short-circuiting occurs in the temperature sensor circuit 11, for example the voltage at a node 6 falls. The second reference voltage V2 is set at a voltage (for example, 0.4 V) that permits detection of such a fall in voltage. Such a fall in the voltage at a node 6 occurs, for example, when the temperature sensor 4 in any temperature detection unit 23 is short-circuited (when both ends of the temperature sensor 4 is short-circuited together). When this happens, the corresponding node 6 is kept serially connected to the signal ground 16. In the following description, this state is referred to as a "short-circuited state", and the state other than the "short-circuited state" and the later described "open state", i.e., the state in which the temperatures of the battery cells 3 are being accurately detected is referred to as the "normal state".

Setting the second reference voltage V2 too low makes it impossible to accurately detect short-circuiting in the temperature sensor circuit 11, and setting it too high causes erroneous detection, as short-circuiting in the temperature sensor circuit 11, of a state in which the temperature of any battery cell 3 has risen to make the electrical resistance of the corresponding temperature sensor 4 lower. Thus, the second reference voltage V2 is set at a voltage that permits accurate detection of short-circuiting in the temperature sensor circuit 11 but that does not adversely affect the detection of the temperatures of the battery cells 3 in the normal state.

Specifically, if the anode voltages of the first diodes 8 as observed when the highest temperature among the battery cells 3 is equal to the upper limit temperature in the normal state is 1.2 V, and the anode voltages of the first diodes 8 (which is equal to the voltage at the non-inverting input terminal (+) of the second comparator 12) as observed in the short-circuited state is 0.2 V, then, the second reference voltage V2 is set at, for example, 0.4 V (0.2 V<0.4 V<1.2 V). That is, the second reference voltage V2 is so set as to fulfill at least the following conditions: it is higher than the anode voltages of the first diodes 8 as observed when the temperature sensor 4 of any temperature detection unit 23 is short-circuited, and it is lower than the anode voltage of the first diodes 8 as observed when the highest temperature among the battery cells 3 is equal to the upper limit temperature.

In the normal state, the voltages at all the nodes 6 are higher than the second reference voltage V2, and thus the second comparator 12 outputs a "high". When, in the short-circuited state, the voltage at any node 6 becomes lower than the second reference voltage V2, the second comparator 12 turns its output from "high" to "low". Thus, the second comparator 12 outputs a "low" signal as a fault signal indicating the short-circuited state. The signals fed to the non-inverting input terminal (+) and inverting input terminal (−) of the second comparator 12 may be reversed so that it outputs a "high" signal as a fault signal indicating the short-circuited state.

The third comparator 13 receives, at the non-inverting input terminal (+) thereof, a third reference voltage V3, and the third comparator 13 compares the highest voltage among the nodes 6 with the third reference voltage V3. Here, the highest voltage among the nodes 6 refers to the voltage at, of all the n nodes 6, the one that yields the highest voltage. When an open state occurs in the temperature sensor circuit 11, the voltage at a node 6 rises to the supply voltage from the power supply 9, specifically 5 V, or to a voltage close thereto. Such a rise in the voltage occurs, for example, when the temperature sensor 4 of any temperature detection unit 23 is disconnected or broken. In the following description, this state is referred to as the "open state". For the detection of the highest voltage among the nodes 6, the inverting input terminal (−) of the third comparator 13 is connected via the second diodes 14 to all the nodes 6. To permit the third comparator 13 to detect the highest voltage among the nodes 6, the second diodes 14 are connected in the direction opposite to the first diodes 8, i.e., in such a direction as to permit a current to flow from the nodes 6 to the input side of the third comparator 13.

The third reference voltage V3 is set at a voltage higher than the first reference voltage V1. The third reference voltage V3 is set at a voltage (for example 4.8 V) that permits detection of whether or not an open state has occurred. Setting the third reference voltage V3 too high makes it impossible to accurately detect an open state in the temperature sensor circuit 11, and setting it too low causes erroneous detection, as an open state, of a state in which the temperature of any battery cell 3 has fallen to make the electrical resistance of the corresponding temperature sensor 4 higher. Thus, the third reference voltage V3 is set at a voltage that permits accurate detection of an open state in the temperature sensor circuit 11 but that does not adversely affect the detection of the temperatures of the battery cells 3 in the normal state.

Specifically, if the anode voltages of the first diodes 8 as observed when the temperatures of all the battery cells 3 are equal to the lowest imaginable temperature (a predetermined low limit temperature) in the normal state is 4.0 V, and the voltage at the inverting input terminal (−) of the third comparator 13 in the open state is 4.9 V, then the third reference voltage V3 is set at, for example, 4.8 V (4.0 V<4.8 V<4.9 V). That is, the third reference voltage V3 is so set as to fulfill at least the following conditions: it is lower than the cathode voltages of the second diodes 14 as observed when the temperature sensor 4 of any temperature detection unit 23 becomes open (disconnected or broken), and it is higher than the cathode voltages of the second diodes 14 as observed when the temperatures of all the battery cells 3 are equal to the above-mentioned lower limit temperature.

In the normal condition, the voltages at all nodes 6 are lower than the third reference voltage V3, and the pull-down resistor 15 makes the voltage at the inverting input terminal (−) of the third comparator 13 lower than the third reference voltage V3. Thus, the third comparator 13 outputs a "high". When, in the open state, the voltage at any node 6 becomes higher than the third reference voltage V3, the third comparator 13 turns its output from "high" to "low". Thus, the third comparator 13 outputs a "low" signal as a fault signal indicating the open state. The signals fed to the non-inverting input terminal (+) and inverting input terminal (−) of the third comparator 13 may be reversed so that it outputs a "high" signal as a fault signal indicating the open state.

A fall in the voltage at a node 6 in the normal and short-circuited states and a rise in the voltage at a node 6 in the open state may be detected by any method other than one using comparators as described above (for example, by a detection method using a microcomputer).

The temperature detection circuit 2 further includes a fault signal evaluation circuit (fault evaluation circuit) 17 and a high temperature signal evaluation circuit 18. The fault signal evaluation circuit 17 is an AND circuit whose input side is connected to the output side of the second comparator 12 and to the output side of the third comparator 13. The high temperature signal evaluation circuit 18 is an AND circuit whose input side is connected to the output side of the first comparator 7 and to the output side of the fault signal evaluation circuit 17. When either the output of the second or third comparator 12 or 13 turns from "high" to "low", the fault signal evaluation circuit 17 turns its output from "high" to "low". Thus, if a short-circuited or open state occurs in the temperature sensor circuit 11, the fault signal evaluation circuit 17 turns its output from "high" to "low" to indicate that a short-circuited or open state has occurred in a temperature sensor 4. In the normal state, the high temperature signal evaluation circuit 18 indicates whether or not the temperature of any battery cell 3 is higher than the upper limit temperature. In the normal state, i.e., in the state in which the output of the fault signal evaluation circuit 17 is "high", when the temperature of any battery cell 3 becomes higher than the upper limit temperature and thus the output of the first comparator 7 turns from "low" to "high", the high temperature signal evaluation circuit 18 turns its output from "low" to "high". Thus, in response to a "high" signal outputted from the high temperature signal evaluation circuit 18, the temperature sensor 4 operates normally, making it possible to detect a battery cell 3 having become hotter than the upper limit temperature.

In this embodiment, the fault signal evaluation circuit 17 and the high temperature signal evaluation circuit 18 are each realized with an AND circuit. According to the present invention, however, the fault signal evaluation circuit and the high temperature signal evaluation circuit are not limited to AND circuits. For example, in a circuit in which the second and third comparators output a "high" as a fault signal, the fault signal evaluation circuit may be an OR circuit. When a short-circuited or open state occurs and thus the output of either the second or third comparator turns its output from "low" to "high", this fault signal evaluation circuit turns its output from "low" to "high" to indicated that a short-circuited or open state has occurred. When this modification is made, by designing the first comparator to output a "low" as a high temperature signal, it is possible to realize the high temperature signal evaluation circuit with an OR circuit. In the normal state, i.e., in the state where the output of the fault signal evaluation circuit is "low", when the temperature of any battery cell becomes higher than the upper limit temperature and thus the first comparator outputs a "low", this high signal evaluation circuit turns its output from "high" to "low". Thus, in response to a "low" signal outputted from the high temperature signal evaluation circuit, the temperature sensor operates normally, making it possible to detect a battery cell 3 having become hotter than the upper limit temperature.

Figure 2:
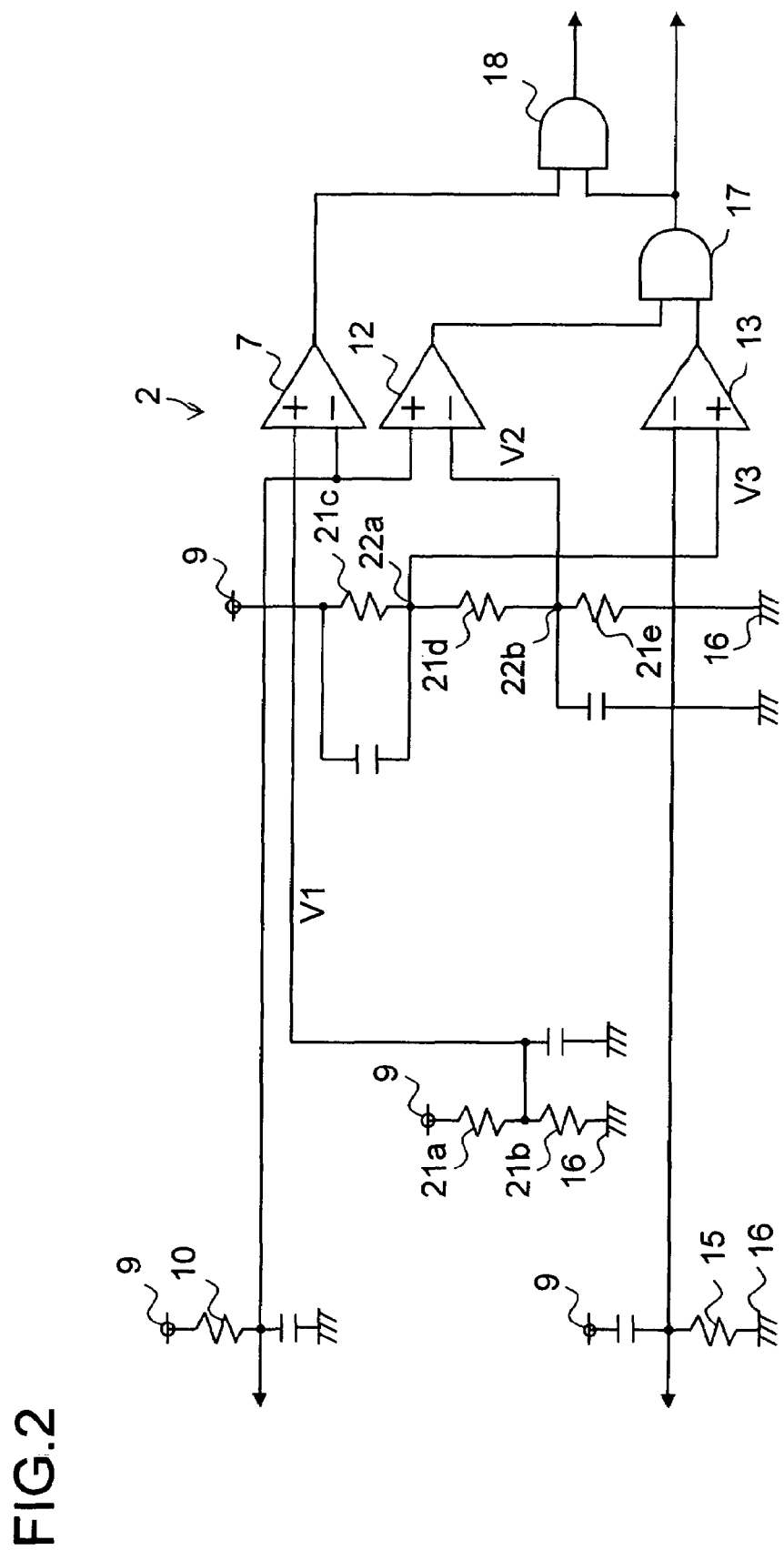
FIG. 2 is a circuit diagram showing how a first, a second, and a third reference voltage are fed respectively to the first, second, and third comparators shown in FIG. 1.

FIG. 2 shows the circuit that feeds the first, second, and third reference voltages V1, V2, and V3 to the first, second, and third comparators 7, 12, and 13, respectively. In FIG. 2, such portions as are found also in FIG. 1 are identified with common symbols, and overlapping explanations will not be repeated. The first reference voltage V1 is produced by dividing the supply voltage of the power supply 9 with two voltage division resistors 21a and 21b. The second and third reference voltages V2 and V3 are produced by dividing the supply voltage of the power supply 9 with three voltage division resistors 21c, 21d, and 21e. The positive side output terminal of the power supply 9 is connected via the voltage division resistors 21c, 21d, and 21e in this order to the signal ground 16. The voltage at the node 22a between the voltage division resistors 21c and 21d is fed, as the third reference voltage V3, to the third comparator 13. The voltage at the node 22b between the voltage division resistors 21d and 21e is fed, as the second reference voltage V2, to the second comparator 12.

Second Embodiment

Figure 3:
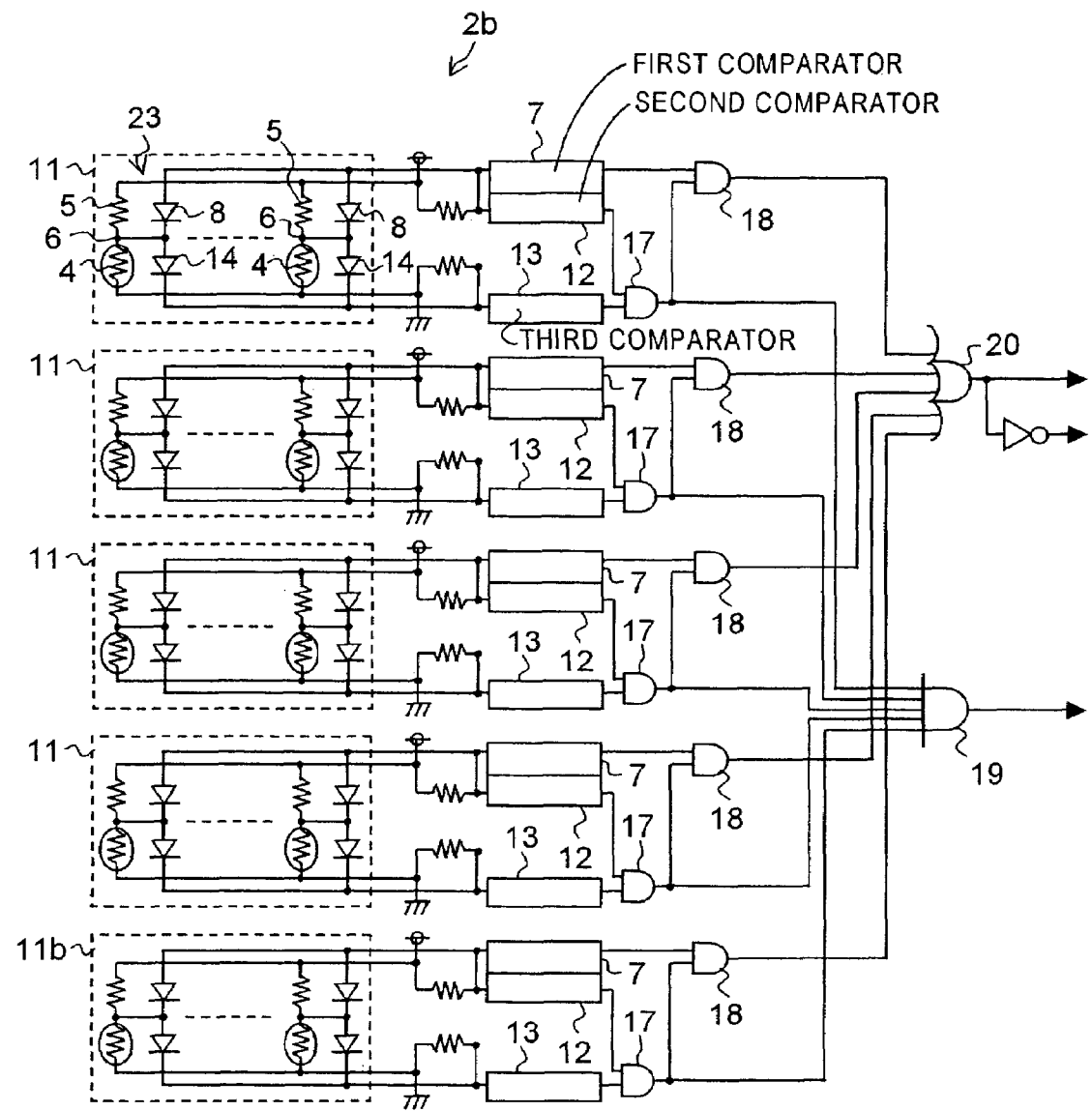
FIG. 3 is a circuit diagram of the power supply apparatus of a second embodiment of the invention.

Next, the power supply apparatus of a second embodiment of the present invention will be described with reference to the drawings. FIG. 3 shows a circuit diagram of the power supply apparatus of the second embodiment. In FIG. 3, such portions as are found also in the FIG. 1 are identified with common symbols, and no explanations of their design and operation will be repeated.

The power supply apparatus shown in FIG. 3 includes: a battery 1 shown in FIG. 1; and a temperature detection circuit 2b for detecting the temperature of the battery 1 (not shown in FIG. 3). The temperature detection circuit 2b includes four temperature sensor circuits 11 and one temperature sensor circuit 11b. The battery 1 is composed of, for example, 130 battery cells 3 connected in series with one another, and the temperatures of these 130 battery cells 3 are detected by the four plus one temperature sensor circuits 11 and 11b. For example, the four temperature sensor circuits 11 each have 30 temperature detection units 23 so that the temperatures of 30 battery cells 3 are detected with 30 temperature sensors 4. On the other hand, the one temperature sensor circuit 11b has 10 temperature detection units 23 so that the temperatures of 10 battery cells 3 are detected with 10 temperature sensors 4.

Figure 4:
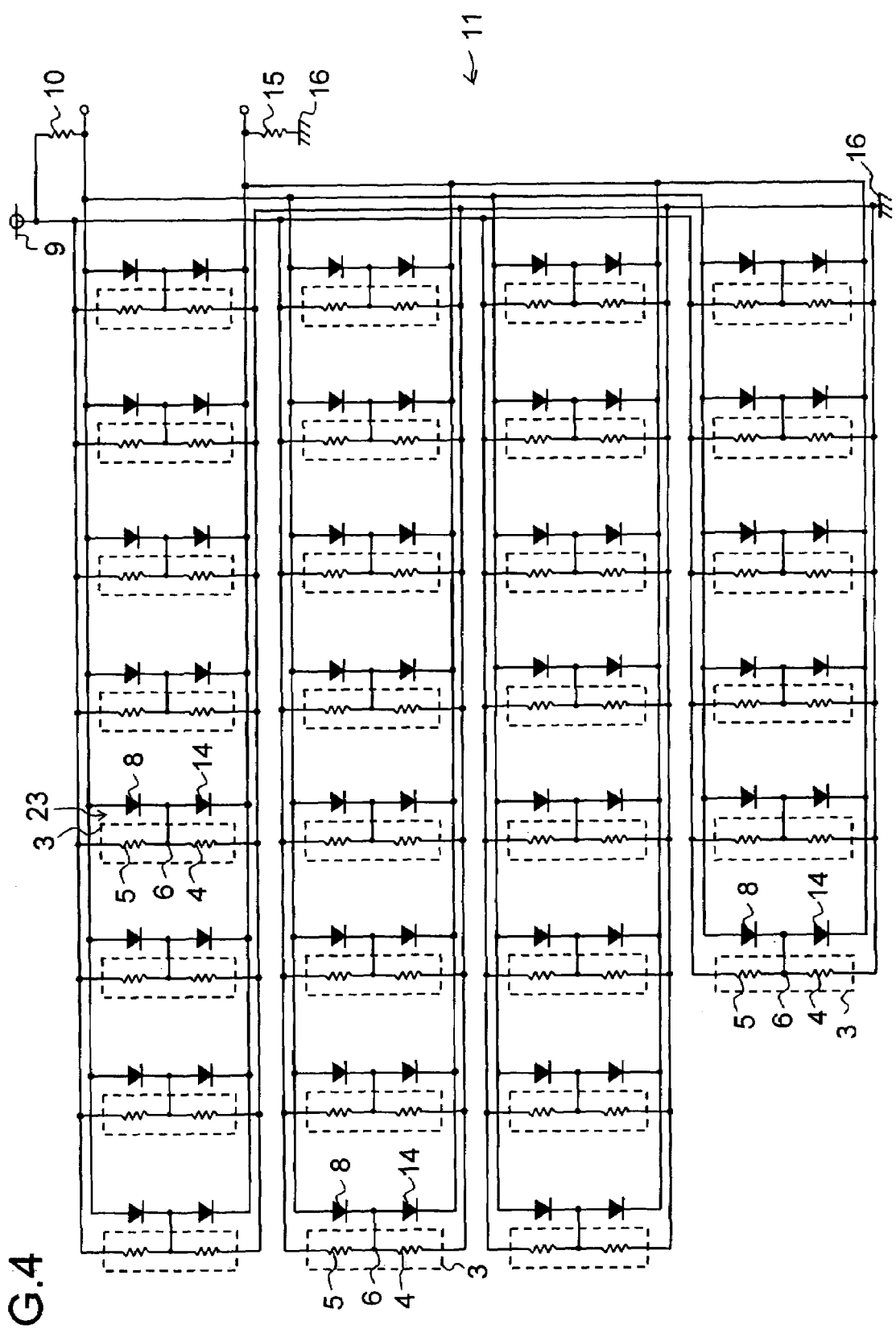
FIG. 4 is a circuit diagram of each of the temperature sensor circuits shown in FIG. 3.

FIG. 4 shows a circuit diagram of the temperature sensor circuit 11 shown at the top in FIG. 3. In FIG. 4, such portions as are found also in FIGS. 1 and 3 are identified with common symbols, and no explanations of their design and operation will be repeated. The other temperature sensor circuits 11 shown in FIG. 3 have the same circuit design as the one shown in FIG. 4. The temperature sensor circuit 11b shown in FIG. 3 also has the same circuit design as the temperature sensor circuits 11 except that the former has a different number of temperature detection units 23 from the latter.

As shown in FIG. 4, the temperature sensor circuit 11 has 30 temperature sensors 4. In the temperature sensor circuit 11 shown in FIG. 4, (a total of 30) serial circuits each composed of a serial resistor 5 and a temperature sensor 4 are connected in parallel with one another, and each serial circuit is connected between the positive side output terminal of a power supply 9 and a signal ground 16. All the nodes 6 within the temperature sensor circuit 11 shown in FIG. 4 are connected via first diodes 8 to the input terminals of first and second comparators 7 and 12, and via second diodes 14 to the input terminal of a third comparator 13 (see also FIG. 3).

As shown in FIG. 3, the output terminal of a fault signal evaluation circuit 17 for detecting a short-circuited or open state in each of the temperature sensor circuits 11 and the output terminal of a fault signal evaluation circuit 17 for detecting a short-circuited or open state in the temperature sensor circuit 11b are all connected to the input side of an output-side fault evaluation circuit 19. The output-side fault evaluation circuit 19 is a five-input AND circuit, and thus, when any of the fault signal evaluation circuits 17 outputs a "low", the output-side fault evaluation circuit 19 turns its output from "high" to "low". That is, the output-side fault evaluation circuit 19 detects whether or not a short-circuited or open state has occurred in any temperature sensor circuit 11 or 11b. When none of the temperature sensor circuits 11 and 11b is in a short-circuited or open state, and thus all the temperature sensors 4 are operating normally, the output-side fault evaluation circuit 19 outputs a "high".

The output terminal of a high temperature signal evaluation circuit 18 corresponding to each of the temperature sensor circuits 11 and the output terminal of a high temperature signal evaluation circuit 18 corresponding to the temperature sensor circuit 11b are all connected to the input side of an output-side high temperature evaluation circuit 20. The output-side high temperature evaluation circuit 20 shown in FIG. 3 is a five-input OR circuit, and thus, when any of the high temperature signal evaluation circuit 18 outputs a "high", the output-side high temperature evaluation circuit 20 turns its output from "low" to "high". That is, the output-side high temperature evaluation circuit 20 detects whether or not any of the battery cells 3 constituting the battery 1 has become hotter than the upper limit temperature. When all the battery cells 3 are colder than the upper limit temperature, the output-side high temperature evaluation circuit 20 outputs a "low".

However, according to the present invention, the output-side fault evaluation circuit and the output-side high temperature evaluation circuit are not limited to an AND circuit and an OR circuit, respectively. As described earlier, in a circuit where, when a short-circuited or open state in a temperature sensor circuit is detected, the output of a fault signal evaluation circuit is turned from "low" to "high", the output-side fault evaluation circuit may be realized with an OR circuit. When any fault signal evaluation circuit outputs a "high", this output-side fault evaluation circuit turns its output from "low" to "high" to detect a short-circuited or open state having occurred in a temperature sensor circuit. On the other hand, in a circuit where, when the temperature of any battery cell becomes higher than the upper limit temperature, a high temperature signal evaluation circuit turns its output from "high" to "low", the output-side high temperature evaluation circuit may be realized with an AND circuit. When any high temperature signal evaluation circuit outputs a "low", this output-side high temperature evaluation circuit turns its output from "high" to "low" to detect a battery cell having become hotter than the upper limit temperature.

Third Embodiment

Figure 5:
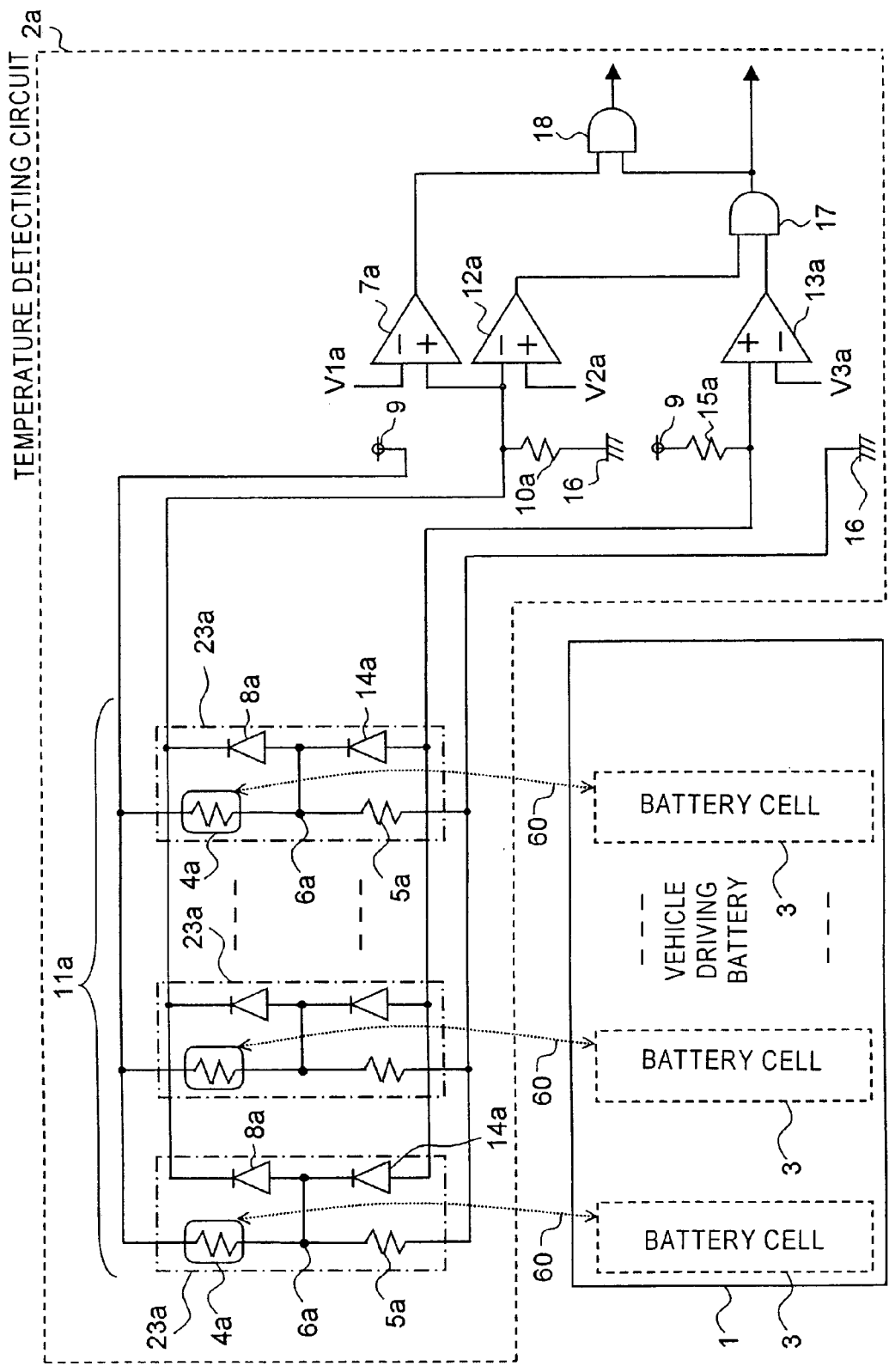
FIG. 5 is a circuit diagram of the power supply apparatus of a third embodiment of the invention.

Next, the power supply apparatus of a third embodiment of the present invention will be described with reference to the drawings. FIG. 5 shows a circuit diagram of the power supply apparatus of the third embodiment. In FIG. 5, such portions as are found also in the FIG. 1 are identified with common symbols, and no explanations of their design and operation will be repeated.

The power supply apparatus shown in FIG. 5 includes: a battery 1; and a temperature detection circuit 2a for detecting the temperature of the battery 1. The temperature detection circuit 2a includes: the same number of temperature detection units 23a as there are battery cells 3 (i.e., n temperature detection units 23a), with the temperature detection units 23a used to detect the temperatures of the battery cells 3 individually; a power supply (power supply circuit) 9; a first comparator 7a; a second comparator 12a; a third comparator 13a; a pull-down resistor 10a; and a pull-up resistor 15a. The n temperature detection units 23a together form a temperature sensor circuit 11a.

Each temperature detection unit 23a includes: a temperature sensor 4a that is thermally coupled to one of the battery cells 3 constituting the battery 1 and that detects the temperature of the battery cell 3 to which it is thermally coupled; a serial resistor 5a that is connected in series with the temperature sensor 4a; a first diode 8a; and a second diode 14a. The temperature sensor 4a, serial resistor 5a, first diode 8a, and second diode 14a provided in each temperature detection unit 23a are respectively the same components as the temperature sensor 4, serial resistor 5, first diode 8, and second diode 14 shown in FIG. 1, and therefore no explanations of their functions will be repeated. The components used and the interconnection among them are the same in all the temperature detection units 23a. In FIG. 5, each temperature detection unit 23a is demarcated by dot-and-dash lines. Moreover, in FIG. 5, arrowed dotted lines 60 conceptually indicate how the individual temperature sensors 4a are thermally coupled to the corresponding battery cells 3.

In each temperature detection unit 23a, one end of the serial resistor 5a is connected to one end of the temperature sensor 4a, and the other end of the serial resistor 5a is connected to signal ground 16 so as to be kept fixed at 0 V. In each temperature detection unit 23a, the end of the temperature sensor 4a opposite to the node 6a between it and the serial resistor 5a is connected to the power supply 9 (to the positive-side output terminal of the power supply 9) so as to receive a 5 V supply voltage outputted from the power supply 9. Needless to say, the supply voltage outputted from the power supply 9 may be other than 5 V. In each temperature detection unit 23a, the anode of the first diode 8a and the cathode of the second diode 14a are both connected to the node 6a. That is, in this embodiment, the first diode 8a is connected to the node 6a so that the forward direction thereof coincides with the direction in which a current flows away from the node 6a; the second diode 14a is connected to the node 6a so that the forward direction thereof coincides with the direction in which a current flows toward the node 6a.

The cathodes of the first diodes 8a of all the temperature detection units 23a are connected together, and their common node is connected via the pull-down resistor 10a to the signal ground 16, and is also connected commonly to the non-inverting input terminal (+) of the first comparator 7a and to the inverting input terminal (−) of the second comparator 12a. The anodes of the second diodes 14a of all the temperature detection units 23a are connected together, and their common node is connected via the pull-up resistor 15a to the power supply 9 (to the positive-side output terminal of the power supply 9), and is also connected to the non-inverting input terminal (+) of the third comparator 13a. The number of temperature detection units 23a included in the temperature sensor circuit 11a (i.e., the value of n) is, for example, 10 to 50 (needless to say, any other number will do). In this case, 10 to 50 nodes 6a are connected via the first diodes 8a to the input side of the first comparator 7a.

The temperature sensors 4a are so arranged as to be thermally coupled to the battery cells 3 on a one-to-one basis. That is, the first, second, third, . . . , and nth temperature sensors 4a are so arranged as to be thermally coupled to the first, second, third, . . . , and nth battery cells 3, respectively. The first, second, third, . . . , and nth temperature sensors 4a are provided in the first, second, third, . . . , and nth temperature detection units 23a, respectively. The individual temperature sensors 4a are thermally coupled to the battery cells 3 in the same manner as the individual temperature sensors 4 are thermally coupled to the battery cells 3 (the first embodiment). Each temperature sensor 4a may be thermally coupled to a plurality of battery cells 3 as each temperature sensor 4 is in the first embodiment.

The temperature sensors 4a are each realized with a device such as a thermistor (for example, an NTC—negative temperature coefficient—thermistor) whose electrical resistance decreases as the temperature of the battery cell 3 to which it is thermally coupled (and thus the temperature of the temperature sensor 4a itself) increases. The temperature coefficient of the electrical resistance of each serial resistor 5a is sufficiently low as compared with the temperature coefficient of the electrical resistance of each temperature sensor 4a, and the electrical resistance of each serial resistor 5a is assumed to remain substantially fixed over the use temperature range of the serial resistor 5a. The pull-down resistor 10a is given an electrical resistance, for example 100 kΩ, sufficiently high as compared with that of each serial resistor 5a. This pull-down resistor 10a pulls down the non-inverting input terminal (+) of the first comparator 7a and the inverting input terminal (−) of the second comparator 12a. The pull-up resistor 15a is given an electrical resistance, for example 100 kΩ, sufficiently high as compared with that of each serial resistor 5a. This pull-up resistor 15a pulls up the non-inverting input terminal (+) of the third comparator 13a.

In the following description of this embodiment, for the sake of simplicity, the temperature of each temperature sensor 4a is assumed to be equal to that of the battery cell 3 to which it is thermally coupled, and the forward voltages of the first and second diodes 8a and 14a are ignored.

In each temperature detection unit 23a, the electrical resistance of the temperature sensor 4a decreases as the temperature of the battery cell 3 (hereinafter referred to simply as the "cell temperature" also) to which it is thermally coupled increases, causing the voltage at the node 6a to increase accordingly. This is because the serial circuit composed of each temperature sensor 4a and the corresponding serial resistor 5a receives, at both ends thereof, a positive voltage of 5 V relative to the serial resistor 5a side thereof.

For example, if the temperatures of the first to (n−1)th battery cells 3 are all equal, and in addition the temperature of the nth battery cell 3 is higher than the temperatures of the other battery cells, the voltage at the node 6a in the nth temperature detection unit 23a is higher than the voltage at the nodes 6a in the first to (n−1)th temperature detection units 23a. Thus, at the non-inverting input terminal (+) of the first comparator 7a appears the voltage at the node 6a in the nth temperature detection unit 23a. That is, the voltage at, of all the n nodes 6a, the one that yields the highest voltage (hereinafter referred to as the highest voltage among the nodes 6a) appears at the cathode of the first diode 8a.

The first comparator 7a receives, at the inverting input terminal (−) thereof, a first reference voltage V1a that indicate the upper limit temperature of each battery cell 3, and the first comparator 7a compares the highest voltage among the nodes 6a with the first reference voltage V1a. The upper limit temperature in this embodiment is the same as the upper limit temperature in the first embodiment. The first reference voltage V1a is so set that, when the highest temperature among the battery cells 3 is equal to the upper limit temperature thereof, the voltages at the non-inverting input terminal (+) and inverting input terminal (−) of the first comparator 7a are equal.

Since the first comparator 7a receives, at the non-inverting input terminal (+) thereof, the highest voltage among the nodes 6a that indicates the highest temperature among the battery cells 3, it is possible to detect, based on the output of the first comparator 7a, whether or not the highest temperature among the battery cells 3 has reached the upper limit temperature.

Specifically, when the voltages at all the nodes 6a are lower than the first reference voltage V1a, in other words when the temperatures of all the battery cells 3 are lower than the upper limit temperature, the first comparator 7a outputs a "low" (a low-potential signal). This is because the pull-down resistor 10a makes the voltage at the non-inverting input terminal (+) of the first comparator 7a lower than the first reference voltage V1a. On the other hand, when the temperature of at least one battery cell 3 is higher than the upper limit temperature (in other words when the highest temperature among the battery cells 3 is higher than the upper limit temperature), the voltage at the non-inverting input terminal (+) of the first comparator 7a is higher than the first reference voltage V1a, and thus the first comparator 7a outputs a "high" (a high-potential signal).

The "high" signal from the first comparator 7a serves as a high temperature signal. The first reference voltage V1a determines the upper limit temperature of the battery cells 3, i.e., the boundary temperature above or below which the first comparator 7a outputs or does not output the high temperature signal. As in the first embodiment, preferably, the upper limit temperature of the battery cells 3 is set within the range from 50° C. to 60° C. The signals fed to the non-inverting input terminal (+) and inverting input terminal (−) of the first comparator 7a may be reversed so that it outputs a "low" signal as a high temperature signal.

The second comparator 12a receives, at the non-inverting input terminal (+) thereof, a second reference voltage V2a, and the second comparator 12a compares the highest voltage among the nodes 6a with the second reference voltage V2a.

The second reference voltage V2a is set at a voltage higher than the first reference voltage V1a. When short-circuiting occurs in the temperature sensor circuit 11a, for example the voltage at a node 6a rises. The second reference voltage V2a is set at a voltage (for example, 4.6 V) that permits detection of such a rise in voltage. Such a rise in the voltage at a node 6a occurs, for example, when the temperature sensor 4a in any temperature detection unit 23a is short-circuited (when both ends of the temperature sensor 4a is short-circuited together). When this happens, the corresponding node 6a is kept serially connected to the positive-side output terminal of the power supply 9. Also in this embodiment, this state is referred to as a "short-circuited state", and the state other than the "short-circuited state" and the later described "open state", i.e., the state in which the temperatures of the battery cells 3 are being accurately detected is referred to as the "normal state".

The second reference voltage V2a is set at a voltage that permits accurate detection of short-circuiting in the temperature sensor circuit 11a but that does not adversely affect the detection of the temperatures of the battery cells 3 in the normal state. Specifically, if the cathode voltages of the first diodes 8a as observed when the highest temperature among the battery cells 3 is equal to the upper limit temperature in the normal state is 4.0 V, and the cathode voltages of the first diodes 8a (which is equal to the voltage at the inverting input terminal (−) of the second comparator 12a) as observed in the short-circuited state is 4.9 V, then, the second reference voltage V2a is set at, for example, 4.6 V (4.0 V<4.6 V<4.9 V). That is, the second reference voltage V2a is so set as to fulfill at least the following conditions: it is lower than the cathode voltages of the first diodes 8a as observed when the temperature sensor 4a of any temperature detection unit 23a is short-circuited, and it is higher than the cathode voltage of the first diodes 8a as observed when the highest temperature among the battery cells 3 is equal to the upper limit temperature.

In the normal state, the voltages at all the nodes 6a are lower than the second reference voltage V2a, and thus the second comparator 12a outputs a "high". When, in the short-circuited state, the voltage at any node 6a becomes higher than the second reference voltage V2a, the second comparator 12a turns its output from "high" to "low". Thus, the second comparator 12a outputs a "low" signal as a fault signal indicating the short-circuited state. The signals fed to the non-inverting input terminal (+) and inverting input terminal (−) of the second comparator 12a may be reversed so that it outputs a "high" signal as a fault signal indicating the short-circuited state.

The third comparator 13a receives, at the inverting input terminal (−) thereof, a third reference voltage V3a, and the third comparator 13a compares the lowest voltage among the nodes 6a with the third reference voltage V3a. Here, the lowest voltage among the nodes 6a refers to the voltage at, of all the n nodes 6a, the one that yields the lowest voltage. When an open state occurs in the temperature sensor circuit 11a, the voltage at a node 6a falls to 0 V, or to a voltage close to 0 V. Such a fall in the voltage occurs, for example, when the temperature sensor 4a of any temperature detection unit 23a is disconnected or broken. This state is referred to as the "open state".

The third reference voltage V3a is set at a voltage lower than the first reference voltage V1a. The third reference voltage V3a is set at a voltage (for example 0.2 V) that permits detection of whether or not an open state has occurred. The third reference voltage V3a is set at a voltage that permits accurate detection of an open state in the temperature sensor circuit 11a but that does not adversely affect the detection of the temperatures of the battery cells 3 in the normal state.

Specifically, if the cathode voltages of the first diodes 8a as observed when the temperatures of all the battery cells 3 are equal to the lowest imaginable temperature (a predetermined low limit temperature) in the normal state is 1.0 V, and the voltage at the non-inverting input terminal (+) of the third comparator 13a in the open state is 0.1 V, then the third reference voltage V3a is set at, for example, 0.2 V (0.1 V<0.2 V<1.0 V). That is, the third reference voltage V3a is so set as to fulfill at least the following conditions: it is higher than the anode voltages of the second diodes 14a as observed when the temperature sensor 4a of any temperature detection unit 23a becomes open, and it is lower than the anode voltages of the second diodes 14a as observed when the temperatures of all the battery cells 3 are equal to the above-mentioned lower limit temperature.

In the normal condition, the voltages at all nodes 6a are higher than the third reference voltage V3a, and the pull-down resistor 15a makes the voltage at the non-inverting input terminal (+) of the third comparator 13a higher than the third reference voltage V3a. Thus, the third comparator 13a outputs a "high". When, in the open state, the voltage at any node 6a becomes higher than the third reference voltage V3a, the third comparator 13a turns its output from "high" to "low". Thus, the third comparator 13a outputs a "low" signal as a fault signal indicating the open state. The signals fed to the non-inverting input terminal (+) and inverting input terminal (−) of the third comparator 13a may be reversed so that it outputs a "high" signal as a fault signal indicating the open state.

A rise in the voltage at a node 6a in the normal and short-circuited states and a fall in the voltage at a node 6a in the open state may be detected by any method other than one using comparators as described above (for example, by a detection method using a microcomputer).

The temperature detection circuit 2a shown in FIG. 5 further includes a fault signal evaluation circuit (fault evaluation circuit) 17 and a high temperature signal evaluation circuit 18. The fault signal evaluation circuit 17 is an AND circuit whose input side is connected to the output side of the second comparator 12a and to the output side of the third comparator 13a. The high temperature signal evaluation circuit 18 is an AND circuit whose input side is connected to the output side of the first comparator 7a and to the output side of the fault signal evaluation circuit 17. When either the output of the second or third comparator 12a or 13a turns from "high" to "low", the fault signal evaluation circuit 17 turns its output from "high" to "low". In the state in which the output of the fault signal evaluation circuit 17 is "high", when the output of the first comparator 7a turns from "low" to "high", the high temperature signal evaluation circuit 18 turns its output from "low" to "high".

By the same method described in connection with the first embodiment, the circuit of the power supply apparatus may be modified so that the fault signal evaluation circuit 17 and the high temperature signal evaluation circuit 18 in this embodiment are realized with OR circuits. The third and second embodiments may be combined together.

Instead of NTC thermistors, PTC (positive temperature coefficient) thermistors may be used as the temperature sensors 4 or 4a, although this results in less accurate detection of temperatures. When PTC thermistors are used as the temperature sensors 4 or 4a, the circuit design of the power supply apparatus is appropriately modified from that shown in FIGS. 1 to 5 so as to retain all the functions described above.

What is claimed is:

1. A power supply apparatus including a battery for driving a load and a temperature detection circuit for detecting a temperature of the battery, wherein
the battery includes n (where n is an integer equal to or greater than 2) battery cells connected in series or in parallel with one another,
the temperature detection circuit includes m (where m is an integer equal to or greater than 2 and fulfilling n≧m) temperature detection units,
the temperature detection units each including
a temperature sensor that is thermally coupled to one or more of the battery cells and whose electrical resistance decreases as a temperature of the battery cell or battery cells to which the temperature sensor is thermally coupled increases,
a serial resistor that is connected in series with the temperature sensor to form a serial circuit and that permits a voltage at a node between the serial resistor and the temperature sensor to vary as the electrical resistance of the temperature sensor varies, the serial circuit receiving a predetermined voltage such that, as the electrical resistance of the temperature sensor decreases, the voltage at the node decreases, and
a first diode that is connected to the node so that a forward direction thereof coincides with a direction in which a current flows toward the node,
so that there are provided m temperature sensors, m serial resistors, and m first diodes in total, and
the first diodes have anodes thereof connected together.

2. The power supply apparatus of claim 1, wherein
the temperature detection circuit includes
a first comparator that compares a voltage at the anodes of the first diodes that are connected together with a first reference voltage and that then outputs a result of comparison, and
the temperature detection circuit detects, based on an output of the first comparator, whether or not a highest temperature among temperatures of the individual battery cells has reached a predetermined upper limit temperature.

3. The power supply apparatus of claim 2, wherein
the temperature detection circuit includes a second comparator that compares a voltage at the anodes of the first diodes that are connected together with a second reference voltage lower than the first reference voltage and that then outputs a result of comparison, and the temperature detection circuit detects, based on an output of the second comparator, whether or not any temperature sensor is short-circuited.

4. The power supply apparatus of claim 3, wherein the second reference voltage is so set as to be higher than the voltage at the anodes of the first diodes as observed when any temperature sensor is short-circuited.

5. The power supply apparatus of claim 2, wherein the temperature detection units each further include a second diode that is connected to the node so that a forward direction thereof coincides with a direction in which a current flows away from the node, so that there are provided m second diodes in total, the second diodes have cathodes thereof connected together, the temperature detection circuit includes a third comparator that compares a voltage at the cathodes of the second diodes that are connected together with a third reference voltage higher than the first reference voltage and that then outputs a result of comparison, and the temperature detection circuit detects, based on an output of the third comparator, whether or not any temperature sensor is open.

6. The power supply apparatus of claim 5, wherein the third reference voltage is so set as to be lower than the voltage at the cathodes of the second diodes as observed when any temperature sensor is open.

7. The power supply apparatus of claim 5, wherein the third reference voltage is so set as to be higher than the voltage at the cathodes of the second diodes as observed when temperatures of all the battery cells are equal to a predetermined lower limit temperature.

8. The power supply apparatus of claim 1, wherein the temperature sensors are thermistors.

9. The power supply apparatus of claim 2, wherein the temperature detection units each further include a second diode that is connected to the node so that a forward direction thereof coincides with a direction in which a current flows away from the node, so that there are provided m second diodes in total, the second diodes have cathodes thereof connected together, the temperature detection circuit includes a second comparator that compares a voltage at the anodes of the first diodes that are connected together with a second reference voltage lower than the first reference voltage and that then outputs a result of comparison, and a third comparator that compares a voltage at the cathodes of the second diodes that are connected together with a third reference voltage higher than the first reference voltage and that then outputs a result of comparison, the temperature detection circuit detects, based on an output of the second comparator, whether or not any temperature sensor is short-circuited, and detects, based on an output of the third comparator, whether or not any temperature sensor is open, and the temperature detection circuit further includes a fault evaluation circuit that detects, based on the outputs of the second and third comparators, whether or not any temperature sensor is short-circuited or open.

10. A power supply apparatus including a battery for driving a load and a temperature detection circuit for detecting a temperature of the battery, wherein the battery includes n (where n is an integer equal to or greater than 2) battery cells connected in series or in parallel with one another, the temperature detection circuit includes m (where m is an integer equal to or greater than 2 and fulfilling n≧m) temperature detection units, the temperature detection units each including a temperature sensor that is thermally coupled to one or more of the battery cells and whose electrical resistance decreases as a temperature of the battery cell or battery cells to which the temperature sensor is thermally coupled increases, a serial resistor that is connected in series with the temperature sensor to form a serial circuit and that permits a voltage at a node between the serial resistor and the temperature sensor to vary as the electrical resistance of the temperature sensor varies, the serial circuit receiving a predetermined voltage such that, as the electrical resistance of the temperature sensor decreases, the voltage at the node increases, and a first diode that is connected to the node so that a forward direction thereof coincides with a direction in which a current flows away from the node, so that there are provided m temperature sensors, m serial resistors, and m first diodes in total, and the first diodes have cathodes thereof connected together.

11. The power supply apparatus of claim 10, wherein the temperature detection circuit includes a first comparator that compares a voltage at the cathodes of the first diodes that are connected together with a first reference voltage and that then outputs a result of comparison, and the temperature detection circuit detects, based on an output of the first comparator, whether or not a highest temperature among temperatures of the individual battery cells has reached a predetermined upper limit temperature.

12. The power supply apparatus of claim 11, wherein the temperature detection circuit includes a second comparator that compares a voltage at the cathodes of the first diodes that are connected together with a second reference voltage higher than the first reference voltage and that then outputs a result of comparison, and the temperature detection circuit detects, based on an output of the second comparator, whether or not any temperature sensor is short-circuited.

13. The power supply apparatus of claim 12, wherein the second reference voltage is so set as to be lower than the voltage at the cathodes of the first diodes as observed when any temperature sensor is short-circuited.

14. The power supply apparatus of claim 11, wherein the temperature detection units each further include a second diode that is connected to the node so that a forward direction thereof coincides with a direction in which a current flows toward the node, the anodes of the second diodes are so that there are provided m second diodes in total, the second diodes have anodes thereof connected together, the temperature detection circuit includes
- a third comparator that compares a voltage at the anodes of the second diodes that are connected together with a third reference voltage lower than the first reference voltage and that then outputs a result of comparison, and the temperature detection circuit detects, based on an output of the third comparator, whether or not any temperature sensor is open.

15. The power supply apparatus of claim 14, wherein the third reference voltage is so set as to be higher than the voltage at the anodes of the second diodes as observed when any temperature sensor is open.

16. The power supply apparatus of claim 14, wherein the third reference voltage is so set as to be lower than the voltage at the anodes of the second diodes as observed when temperatures of all the battery cells are equal to a predetermined lower limit temperature.

17. The power supply apparatus of claim 10, wherein the temperature sensors are thermistors.

18. The power supply apparatus of claim 11, wherein the temperature detection units each further include
- a second diode that is connected to the node so that a forward direction thereof so that there are provided m second diodes in total,
- the second diodes have anodes thereof connected together, the temperature detection circuit includes
- a second comparator that compares a voltage at the cathodes of the first diodes that are connected together with a second reference voltage higher than the first reference voltage and that then outputs a result of comparison, and
- a third comparator that compares a voltage at the anodes of the second diodes that are connected together with a third reference voltage lower than the first reference voltage and that then outputs a result of comparison, the temperature detection circuit detects, based on an output of the second comparator, whether or not any temperature sensor is short-circuited, and detects, based on an output of the third comparator, whether or not any temperature sensor is open, and the temperature detection circuit further includes
- a fault evaluation circuit that detects, based on the outputs of the second and third comparators, whether or not any temperature sensor is short-circuited or open.

* * * * *